(12) United States Patent
Shih et al.

(10) Patent No.: US 10,587,041 B2
(45) Date of Patent: Mar. 10, 2020

(54) ELECTRONIC PACKAGE STRUCTURE AND FABRICATION METHOD THEREOF

(71) Applicant: Siliconware Precision Industries Co., Ltd., Taichung (TW)

(72) Inventors: Chih-Yuan Shih, Taichung (TW); Chih-Hsien Chiu, Taichung (TW); Yueh-Chiung Chang, Taichung (TW); Tsung-Li Lin, Taichung (TW); Chi-Pin Tsai, Taichung (TW); Chien-Cheng Lin, Taichung (TW); Tsung-Hsien Tsai, Taichung (TW); Heng-Cheng Chu, Taichung (TW); Ming-Fan Tsai, Taichung (TW)

(73) Assignee: Silicon Precision Industries Co., Ltd., Taichung (TW)

( * ) Notice: Subject to any disclaimer, the term of this patent is extended or adjusted under 35 U.S.C. 154(b) by 58 days.

(21) Appl. No.: 15/596,113

(22) Filed: May 16, 2017

(65) Prior Publication Data

US 2018/0090835 A1 Mar. 29, 2018

(30) Foreign Application Priority Data

Sep. 29, 2016 (TW) .............................. 105131255 A
Feb. 16, 2017 (TW) .............................. 106105039 A

(51) Int. Cl.
| | |
|---|---|
| H01L 23/552 | (2006.01) |
| H01Q 1/52 | (2006.01) |
| H01Q 9/42 | (2006.01) |
| H01Q 1/24 | (2006.01) |
| H01L 21/56 | (2006.01) |
| H01L 23/31 | (2006.01) |

(Continued)

(52) U.S. Cl.
CPC ............. *H01Q 1/526* (2013.01); *H01L 21/56* (2013.01); *H01L 23/3121* (2013.01); *H01L 23/49838* (2013.01); *H01L 23/552* (2013.01); *H01L 23/66* (2013.01); *H01Q 1/2283* (2013.01); *H01Q 1/243* (2013.01); *H01Q 1/48* (2013.01); *H01Q 9/42* (2013.01); *H01L 23/498* (2013.01); *H01L 2223/6677* (2013.01); *H01L 2224/48091* (2013.01)

(58) Field of Classification Search
CPC ....... H01L 2924/181; H01L 2223/6677; H01L 2924/3025; H01L 25/0655; H01L 21/56; H01L 21/563; H01L 21/60
USPC .................................................. 257/659, 787
See application file for complete search history.

(56) References Cited

U.S. PATENT DOCUMENTS

| | | | |
|---|---|---|---|
| 6,686,649 B1 * | 2/2004 | Mathews | H01L 23/552 257/659 |
| 6,861,731 B2 * | 3/2005 | Buijsman | H01L 23/552 257/664 |

(Continued)

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

An electronic package structure is provided, including a substrate with an electronic component, an antenna element and a shielding element disposed on the substrate. The shielding element is positioned between the antenna element and the electronic component to prevent electromagnetic interference (EMI) from occurring between the antenna element and the electronic component. A method for fabricating the electronic package structure is also provided.

27 Claims, 10 Drawing Sheets

(51) Int. Cl.
  *H01L 23/498* (2006.01)
  *H01L 23/66* (2006.01)
  *H01Q 1/22* (2006.01)
  *H01Q 1/48* (2006.01)

(56) References Cited

U.S. PATENT DOCUMENTS

| | | | | |
|---|---|---|---|---|
| 6,965,159 | B1* | 11/2005 | Miks | H01L 23/3107 |
| | | | | 257/676 |
| 7,042,398 | B2* | 5/2006 | Tang | H01L 23/04 |
| | | | | 257/659 |
| 7,049,682 | B1* | 5/2006 | Mathews | H01L 23/552 |
| | | | | 257/659 |
| 7,470,977 | B2* | 12/2008 | Okubora | H01L 23/04 |
| | | | | 257/659 |
| 2004/0032371 | A1* | 2/2004 | Mendolia | H01Q 1/243 |
| | | | | 343/702 |
| 2014/0247195 | A1* | 9/2014 | Yen | H01L 23/66 |
| | | | | 343/873 |
| 2015/0194388 | A1* | 7/2015 | Pabst | H01L 23/552 |
| | | | | 257/659 |
| 2016/0240493 | A1* | 8/2016 | Lee | H01L 23/66 |
| 2016/0351525 | A1* | 12/2016 | Chun | H01L 23/49811 |

* cited by examiner

ELECTRONIC PACKAGE STRUCTURE AND FABRICATION METHOD THEREOF

CROSS-REFERENCE TO RELATED APPLICATION

This application claims under 35 U.S.C. § 119(a) the benefit of Taiwanese Patent Application No. 105131255, filed Sep. 29, 2016 and Taiwanese Patent Application No. 106105039, filed Feb. 16, 2017, the entire contents of which are incorporated herein by reference.

BACKGROUND

1. Technical Field

The present disclosure relates to electronic package structures, and, more particularly, to an electronic package structure having an antenna structure.

2. Description of Related Art

Along with the rapid development of electronic industries, wireless communication technologies have been widely applied in various kinds of consumer electronic products for receiving or transmitting various wireless signals. To meet the miniaturization requirement of consumer electronic products, wireless communication modules are becoming compact in size and low in profile. For example, patch antennas have been widely applied in wireless communication modules of electronic products such as cell phones due to their advantages of small size, light weight and easy fabrication.

FIG. 1 is a schematic perspective view of a wireless communication module 1 according to the prior art. The wireless communication module 1 has a substrate 10, a plurality of electronic components 11 disposed on and electrically connected to the substrate 10, an antenna structure 12 disposed on the substrate 10, an encapsulant 13, and a shielding structure 14 disposed on the encapsulant 13. The substrate 10 is a rectangular circuit board. The antenna structure 12 is planar, and has an antenna body 120 and a conductive wire 121 electrically connecting the antenna body 120 and the electronic components 11. The encapsulant 13 encapsulates the electronic components 11 and a portion of the conductive wire 121.

However, during fabrication of the wireless communication module 1, the antenna structure 12 and the shielding structure 14 are formed separately. In particular, the antenna structure 12 is formed before the formation of the encapsulant 13, and the shielding structure 14 is formed after the formation of the encapsulant 13, thus complicating the fabrication process of the wireless communication module 1 and increasing the fabrication cost.

Therefore, how to overcome the above-described drawbacks has become critical.

SUMMARY

In view of the above-described drawbacks, the present disclosure provides an electronic package structure, which comprises: a substrate; at least one electronic component disposed on the substrate; an antenna element disposed on and electrically connected to the substrate; and a shielding element disposed on the substrate between the antenna element and the electronic component, wherein the shielding element and the antenna element are arranged side by side in a horizontal direction relative to a surface of the substrate.

In an embodiment, the electronic package structure further comprises a connecting portion connecting the antenna element and the shielding element. In another embodiment, the connecting portion, the antenna element and the shielding element form an open or closed ring-shaped plane.

In an embodiment, the electronic package structure further comprises a supporting portion extending from the antenna element and the shielding element, wherein at least one assisting region is defined on the substrate around an outer periphery of the electronic component, the antenna element and the shielding element with the supporting portion located on the assisting region. In another embodiment, the shielding element is a metal cover to cover the electronic component and a portion of the surface of the substrate.

The present disclosure further provides a method for fabricating an electronic package structure, comprising: providing a substrate and a functional module, wherein the substrate has at least one electronic component disposed thereon, and the functional module comprises an antenna element, a shielding element, and a connecting portion connecting the antenna element and the shielding element; and disposing the functional module on the substrate with the antenna element and the shielding element vertically disposed on the substrate, wherein the shielding element is positioned between the antenna element and the electronic component, and the shielding element and the antenna element are arranged side by side in a horizontal direction relative to a surface of the substrate.

In an embodiment, the method further comprises removing the connecting portion after the functional module is disposed on the substrate.

In an embodiment, the functional module further comprises a supporting portion extending from the antenna element and the shielding element. When the functional module is disposed on the substrate, the supporting portion is positioned on an assisting region of the substrate. In another embodiment, after the functional module is disposed on the substrate, a singulation process is performed along the assisting region to remove the supporting portion.

In an embodiment, the substrate has a circuit electrically connected to the antenna element.

In an embodiment, the substrate has a grounding pad electrically connected to the shielding element.

In an embodiment, the antenna element is a metal frame.

In an embodiment, the shielding element is a metal frame or a metal cover.

In an embodiment, the shielding element is free from being electrically connected to the antenna element.

In an embodiment, the shielding element is electrically connected to the antenna element.

In an embodiment, the shielding element has a plurality of legs spaced apart from one another.

In an embodiment, the shielding element has a wall-shaped leg positioned between the antenna element and the electronic component.

In an embodiment, an encapsulant is further formed on the substrate to encapsulate the electronic component, the antenna element and the shielding element. In an embodiment, the encapsulant is formed on the substrate to further encapsulate the connecting portion. In an embodiment, a portion of a surface of the antenna element is exposed from the encapsulant. In another embodiment, the portion of the surface of the antenna element is flush with a surface of the encapsulant. In an embodiment, a portion of a surface of the shielding element is exposed from the encapsulant. In another embodiment, the portion of the surface of the shielding element is flush with a surface of the encapsulant. In an embodiment, a portion of a surface of the connecting portion is exposed from the encapsulant. In another embodiment, the portion of the surface of the connecting portion is flush with a surface of the encapsulant. In an embodiment, a metal layer is formed on the encapsulant. In another embodiment, the metal layer is electrically connected to at least one of the antenna element and the shielding element. In an embodiment, the metal layer has separated first and second regions, the first region is electrically connected to the shielding element, and the second region is electrically connected to the antenna. In another embodiment, the second region is formed on the upper surface of the encapsulant and/or the side surface of the encapsulant.

In an embodiment, the substrate has a circuit layer exposed from the side surface thereof, and a metal layer electrically connected to the circuit layer is disposed on the side surface of the substrate and/or the side surface of the encapsulant.

According to the present disclosure, the antenna element and the shielding element form a functional module, and thus can be disposed together on the substrate. Therefore, the fabrication process is simplified, and the fabrication cost is greatly reduced.

Further, since the shielding element is positioned between the antenna element and the electronic component, the present disclosure prevents electromagnetic interference from occurring between the antenna element and the electronic component.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2E are schematic perspective views showing a method for fabricating an electronic package structure 2 according to the present disclosure. In an embodiment, the electronic package structure 2 is a wireless communication module of a system in package (SiP).

Figure 1:
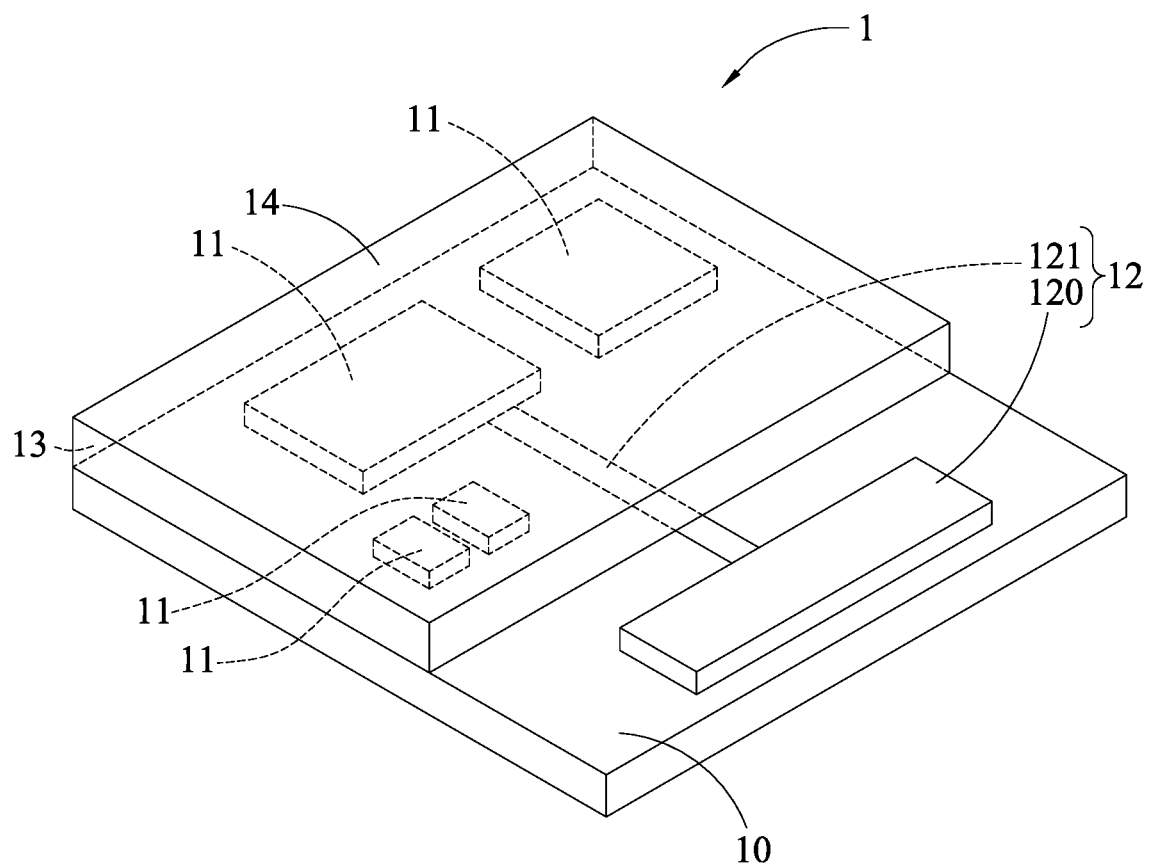
FIG. 1 is a schematic perspective view of a wireless communication module according to the prior art.
Figure 2A:
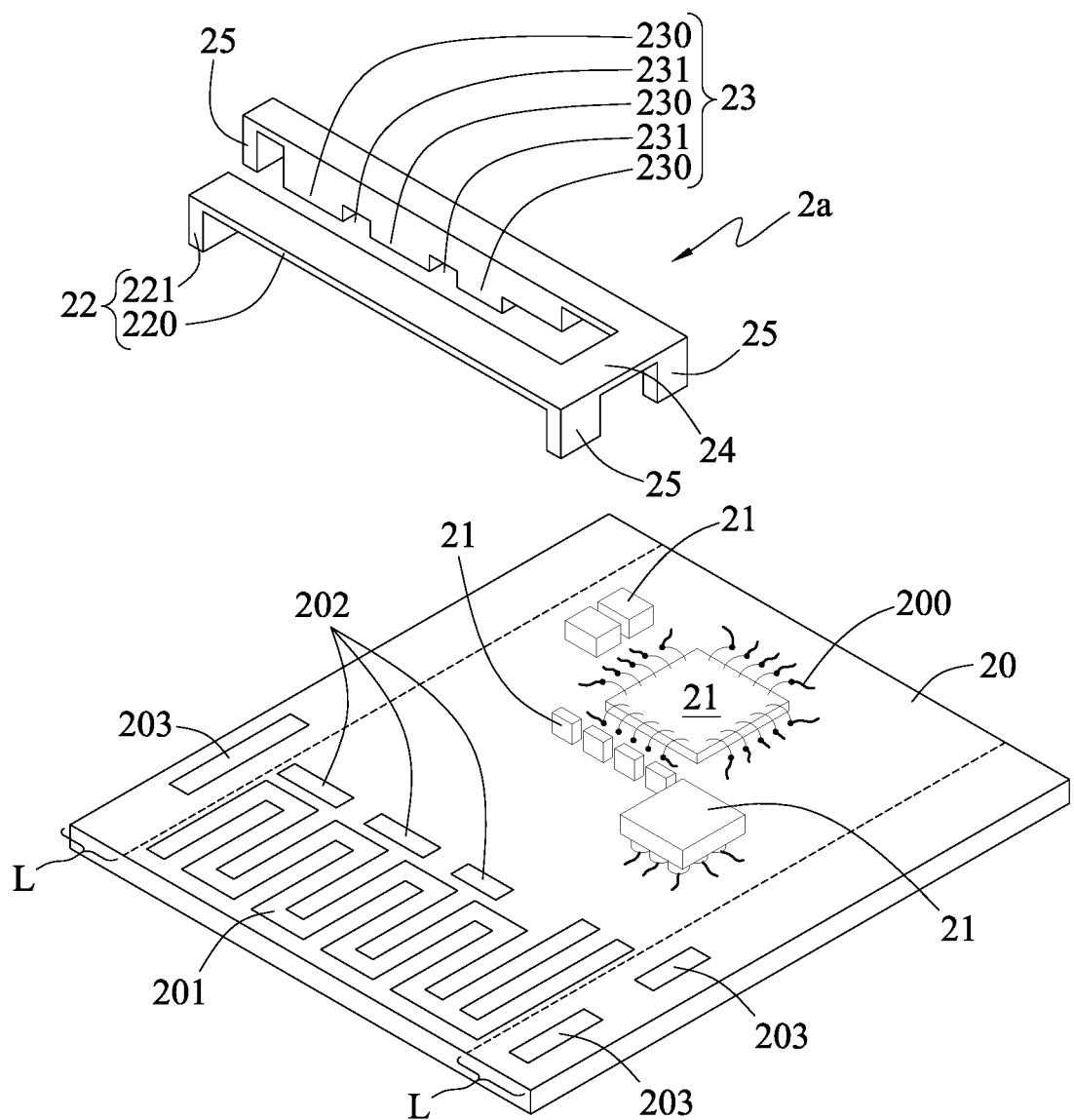
FIGS. 2A to 2E are schematic perspective views showing a method for fabricating an electronic package structure according to the present disclosure, wherein FIG. 2D' shows another embodiment of FIG. 2D.
Figure 2B:
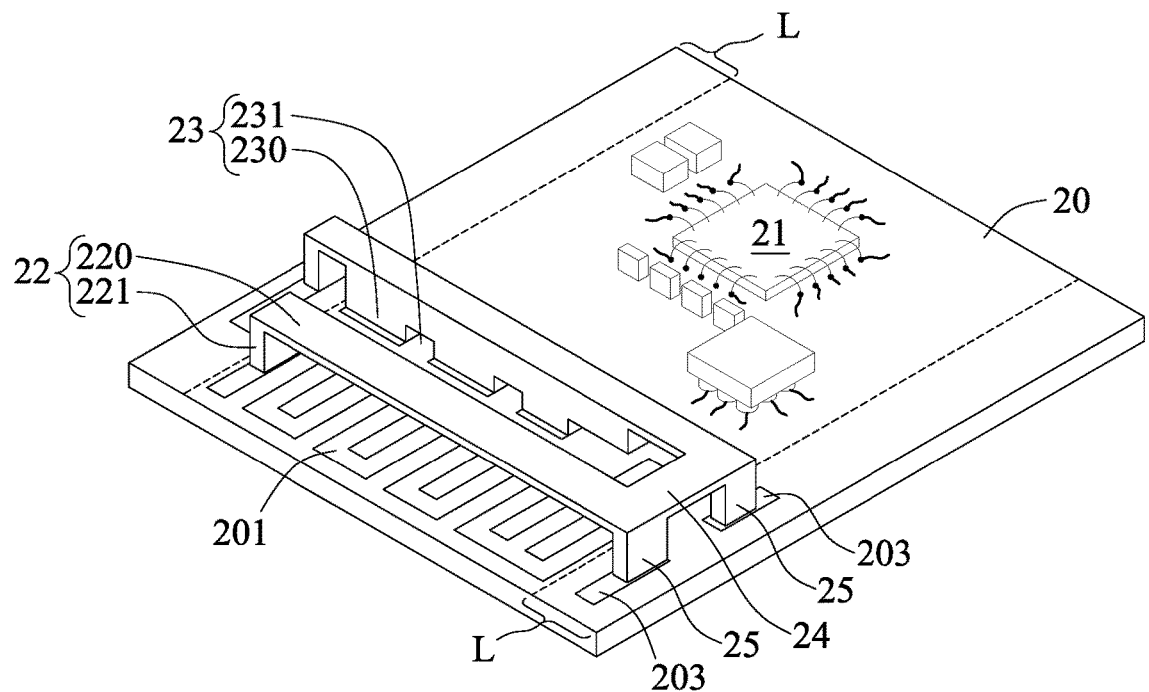

Referring to FIGS. 2A and 2B, a substrate 20 and a functional module 2a are provided. A plurality of electronic components 21 are disposed on the substrate 20. The functional module 2a has an antenna element 22, a shielding element 23, a connecting portion 24 connecting the antenna element 22 and the shielding element 23, and a plurality of supporting portions 25 extending from the antenna element 22 and the shielding element 23 (and the connecting portion 24). The functional module 2a is disposed on the substrate 20 in a manner that the antenna element 22, the shielding element 23 and the supporting portions 25 are vertically disposed on the substrate 20. The shielding element 23 is positioned between the antenna element 22 and the electronic components 21, and the shielding element 23 and the antenna element 22 are arranged side by side in a horizontal direction relative to a surface of the substrate 20.

In an embodiment, the substrate 20 is a lead frame, a fan-out redistribution layer (RDL) structure, a circuit board or a ceramic board, and is rectangular. In another embodiment, the substrate 20 has a plurality of circuits 200 and 201 and a plurality of grounding pads 202 disposed on the surface thereof. In yet another embodiment, the substrate 20 has a circuit layer formed therein (not shown). In further another embodiment, the substrate 20 is defined with an element mounting region for the electronic components 21 and the functional module 2a to be mounted thereon, and an assisting region L around an outer periphery of the element mounting region are defined on the substrate 20.

The electronic components 21 are electrically connected to the circuits 200. At least one of the electronic components 21 is an active component such as a semiconductor chip, a passive component, such as a resistor, a capacitor or an inductor, or a combination thereof.

In an embodiment, the antenna element 22 is a metal frame having a base portion 220 and a foot portion 221. The foot portion 221 is vertically disposed on the substrate 20, and the base portion 220 is supported over the substrate 20 through the foot portion 221. In another embodiment, the foot portion 221 is electrically connected to an input terminal of the circuit 201. Alternatively, the foot portion 221 serves as an input terminal without being electrically connected to the circuit 201. That is, it is not necessary form the circuit 201 to be disposed on the substrate 20. According to the practical need, a plurality of foot portions 221 can be provided.

Figure 3A:
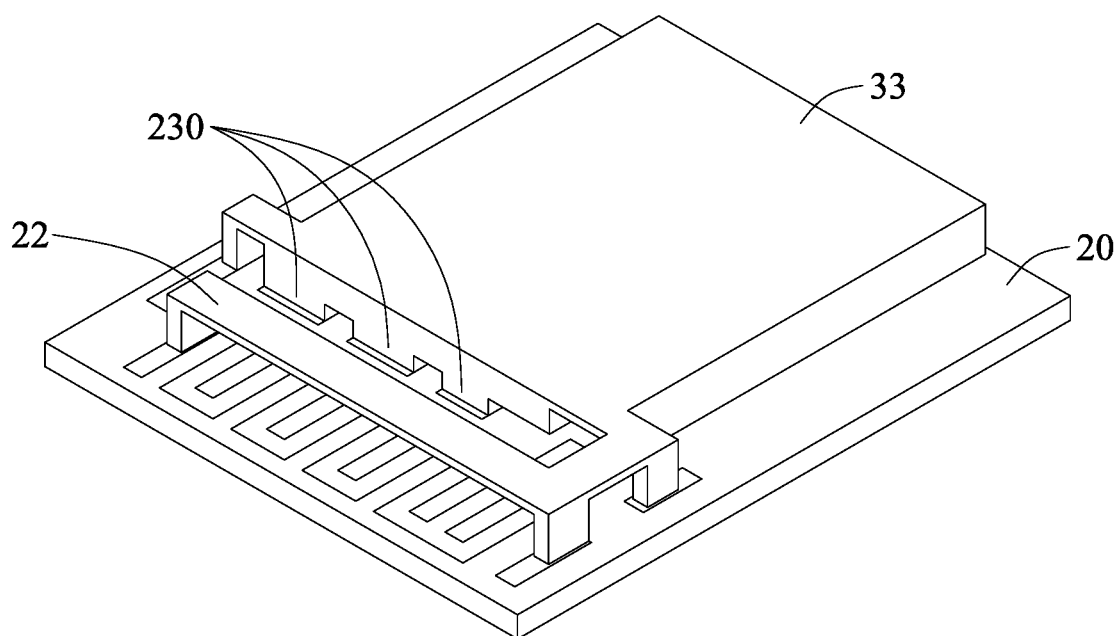
FIG. 3A is a schematic perspective view showing another embodiment of FIG. 2B.
Figure 3B:
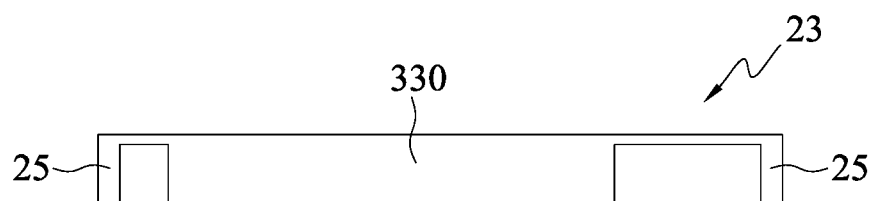
FIG. 3B is a schematic rear view showing another embodiment of a shielding element of FIG. 2A.

In an embodiment, the shielding element 23 is a metal frame having a plurality of legs 230 electrically connected to the grounding pads 202. The legs 230 are spaced apart from one another at an interval 231. In another embodiment, referring to FIG. 3A, the shielding element 33 is a metal cover covering the electronic components 21 and a portion of the surface of the substrate 20, and the legs 230 are positioned between the antenna element 22 and the electronic components 21. In a further embodiment, referring to FIG. 3B, the shielding element 23 only has a wall-shaped leg 330 positioned between the antenna element 22 and the electronic components 21.

Figure 3C:
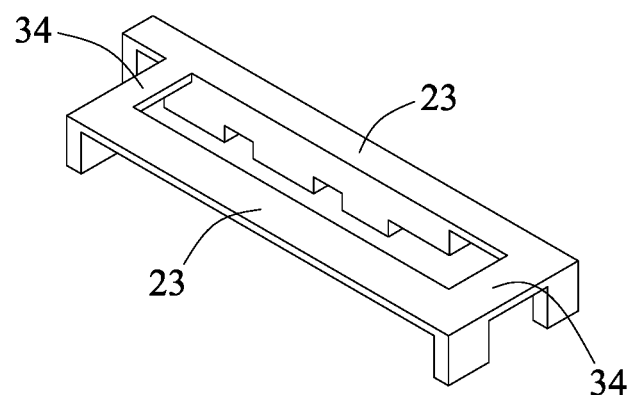
FIG. 3C is a schematic perspective view showing another embodiment of a functional module of FIG. 2A.

The connecting portion 24 connects the antenna element 22 and the shielding element 23 at one end. As such, the connecting portion 24, the antenna element 22 and the shielding element 23 form an open ring-shaped plane, i.e., a ring shape having an opening, such as a substantially C-shape or U-shape. Alternatively, the connecting portion 24 connects the antenna element 22 and the shielding element 23 at any position between the two opposite ends so as to form an H-shaped plane. In another embodiment, referring to FIG. 3C, the connecting portion 34 connects the antenna element 22 and the shielding element 23 at the two opposite ends so as to form a closed ring-shaped plane (for example, a rectangular shape), thus increasing mechanical strength and avoiding stress deformation.

The supporting portions 25 are disposed on contact pads 203 on the assisting region L of the substrate 20.

Figure 2C:
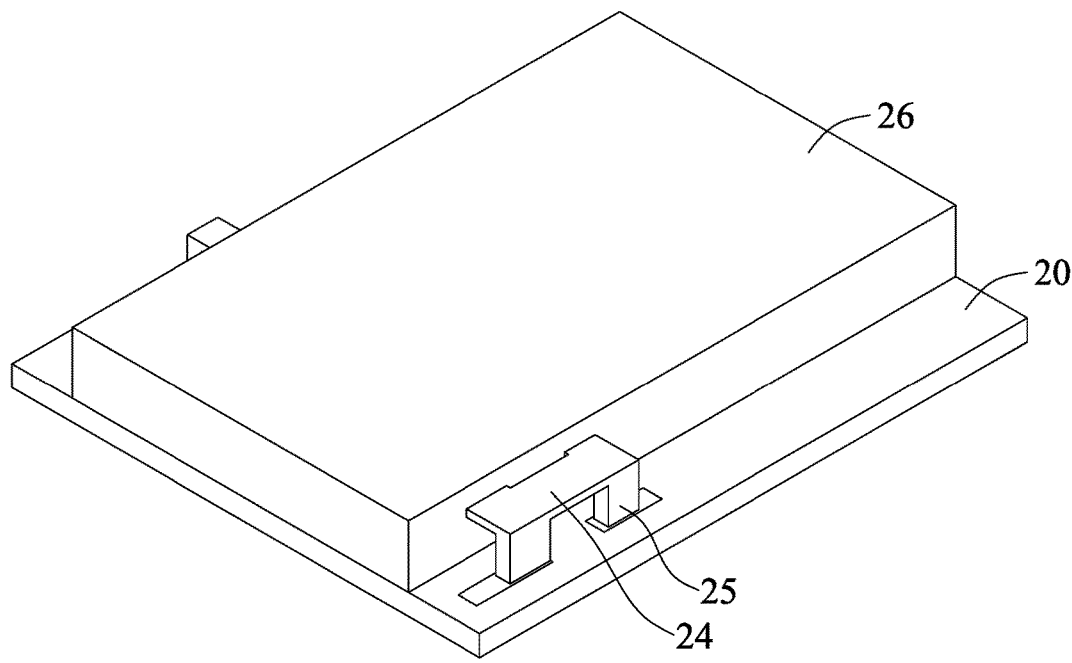

Referring to FIG. 2C, an encapsulant 26 is formed on the substrate 20 except the assisting region L. As such, the encapsulant 26 encapsulates the electronic components 21, the antenna element 22 and the shielding element 23, with the supporting portions 25 exposed.

In an embodiment, the interval 231 between the legs 230 of the shielding element 23 serves as a passageway for the encapsulant 26 to flow therethrough, thereby facilitating the encapsulant 26 to be uniformly formed on the substrate 20.

Figure 5A:
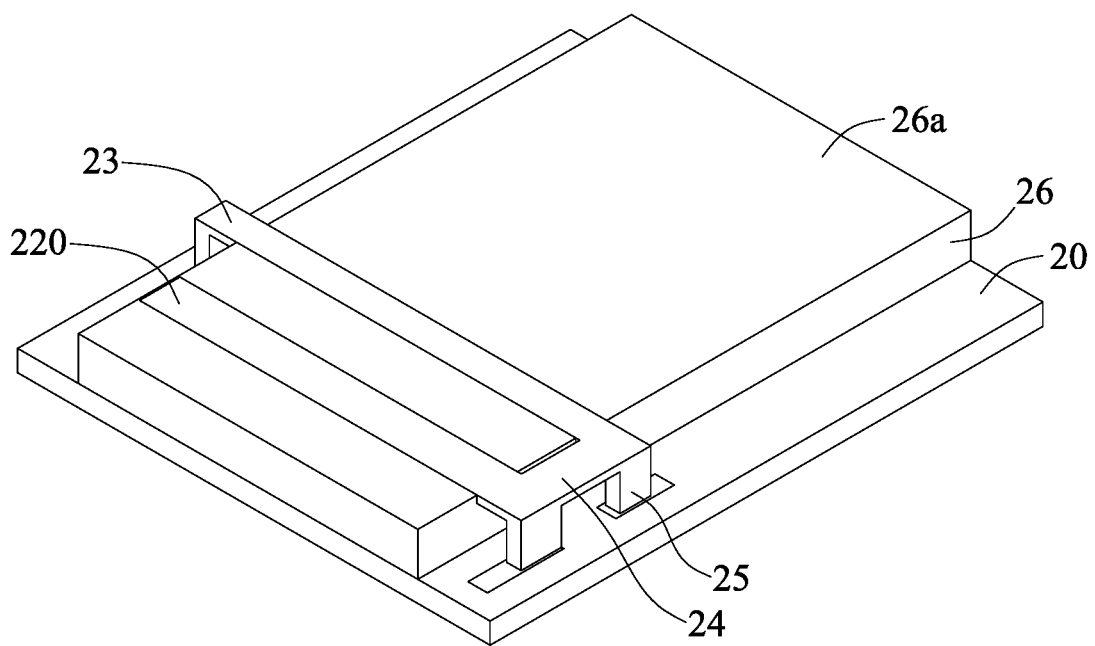
FIGS. 5A and 5B are schematic perspective views showing another embodiment of a method for fabricating an electronic package structure according to the present disclosure.

In an embodiment, the encapsulant 26 does not encapsulate the connecting portion 24. In another embodiment, the encapsulant 26 encapsulates a portion of the connecting portion 24. In a further embodiment, the encapsulant 26 completely encapsulates the electronic components 21 and the functional module 2a (including the antenna element 22, the shielding element 23 and the connecting portion 24). In still another embodiment, as shown in FIG. 5A, the encapsulant 26 encapsulates the electronic components 21 and a portion of the functional module 2a, and a portion of a surface of the functional module 2a (including the antenna element 22, the shielding element 23 and the connecting portion 24) is exposed from an upper surface 26a of the encapsulant 26.

In another embodiment, the encapsulant 26 is also formed on the assisting region L to encapsulate the supporting portions 25.

Figure 2D:
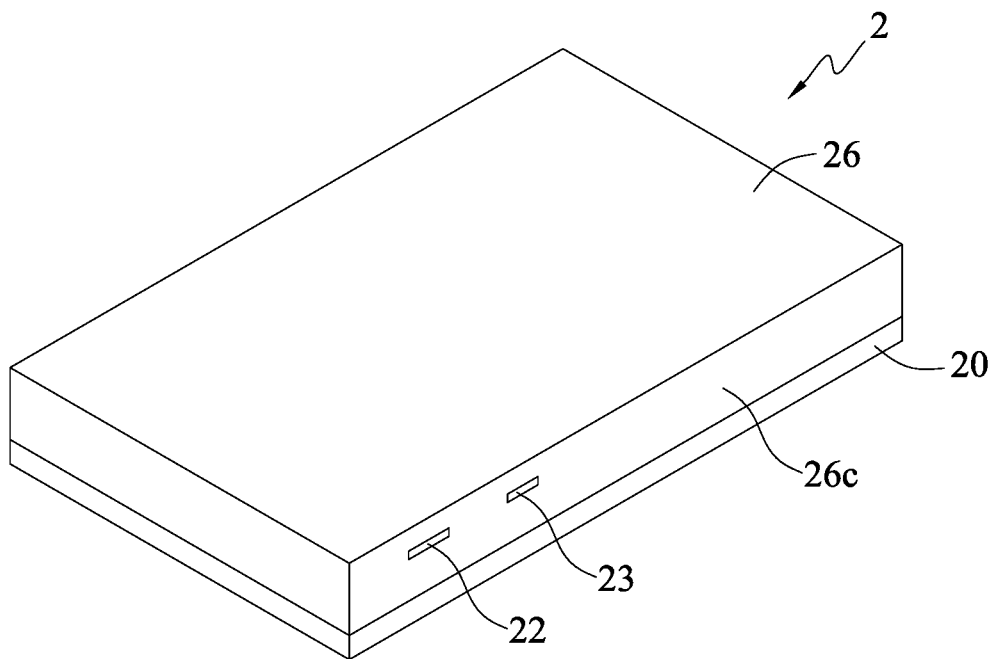
Figure 2D:
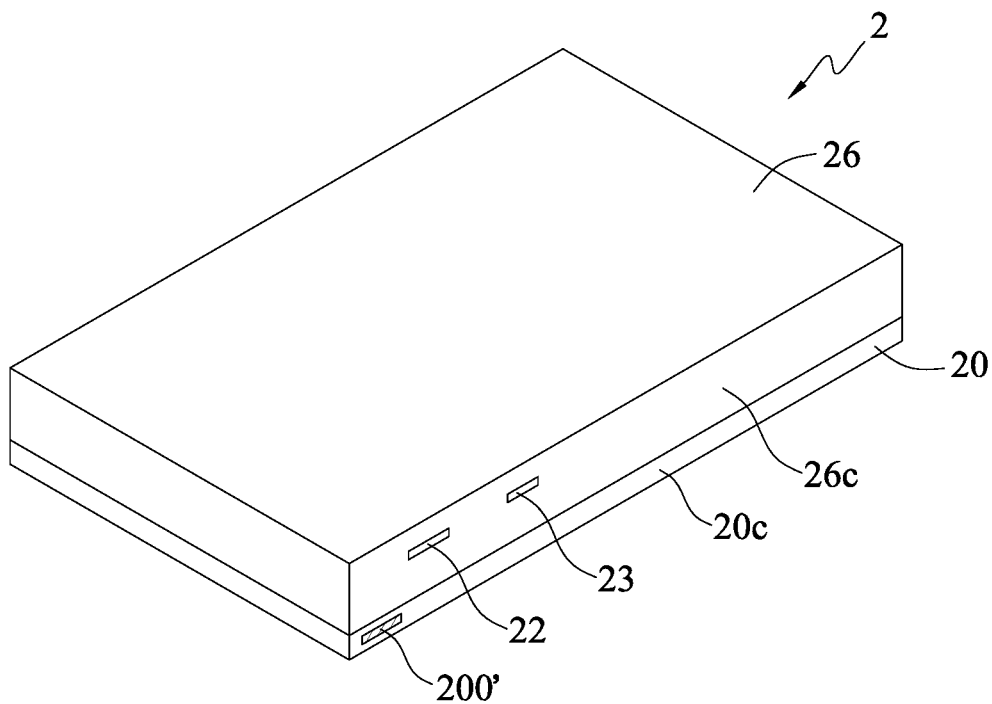

Referring to FIG. 2D, following the process of FIG. 2C, a singulation process is performed along the assisting region L (which is used as a cutting path) to remove the supporting portions 25 and the connecting portion 24. As such, the shielding element 23 is not electrically connected to the antenna element 22.

Figure 4A:
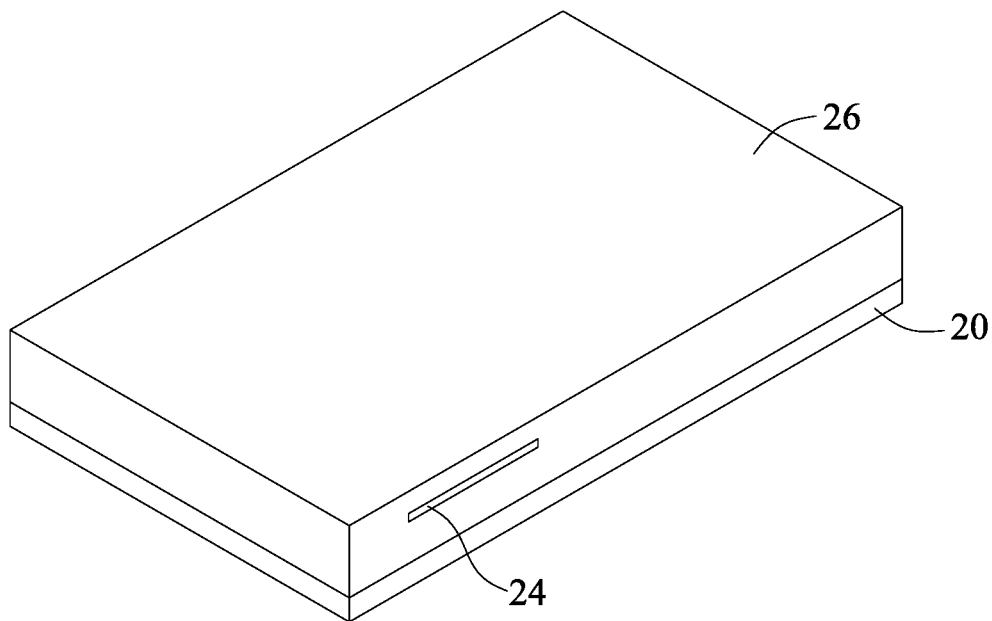
FIG. 4A is a schematic perspective view showing another embodiment of FIG. 2D.
Figure 4B:
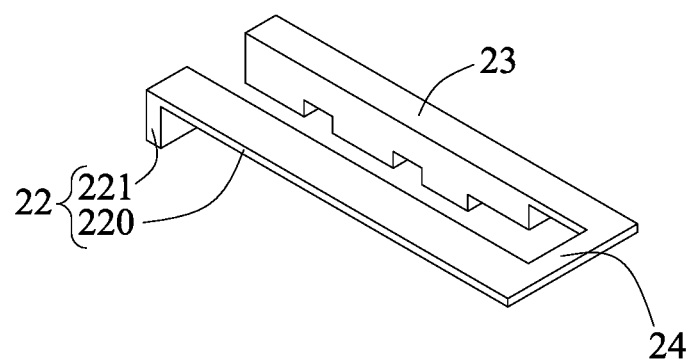
FIG. 4B is a schematic partial perspective view of FIG. 4A.

In an embodiment, a portion of a surface of the antenna element 22 and a portion of a surface of the shielding element 23 are exposed from the encapsulant 26. In another embodiment, the exposed surface of the antenna element 22 and the exposed surface of the shielding element 23 are flush with the side surface 26c of the encapsulant 26. In another embodiment, the encapsulant 26 encapsulates the connecting portion 24, and the singulation process is performed to expose a portion of a surface of the connecting portion 24 from the encapsulant 26. Referring to FIGS. 4A and 4B, the exposed surface of the connecting portion 24 is flush with the side surface 26c of the encapsulant 26. As such, the shielding element 23 is electrically connected to the antenna element 22.

Further, the singulation process can be performed on the electronic package structure 2, without the encapsulant 26 formed.

In another embodiment, the assisting region L does not serve as a cutting path, and thus the assisting region L and the supporting portions 25 are not removed.

In an embodiment, as shown in FIG. 2D', the circuit layer 200' of the substrate 20 is also exposed from the side surface 20c of the substrate 20.

Figure 2E:
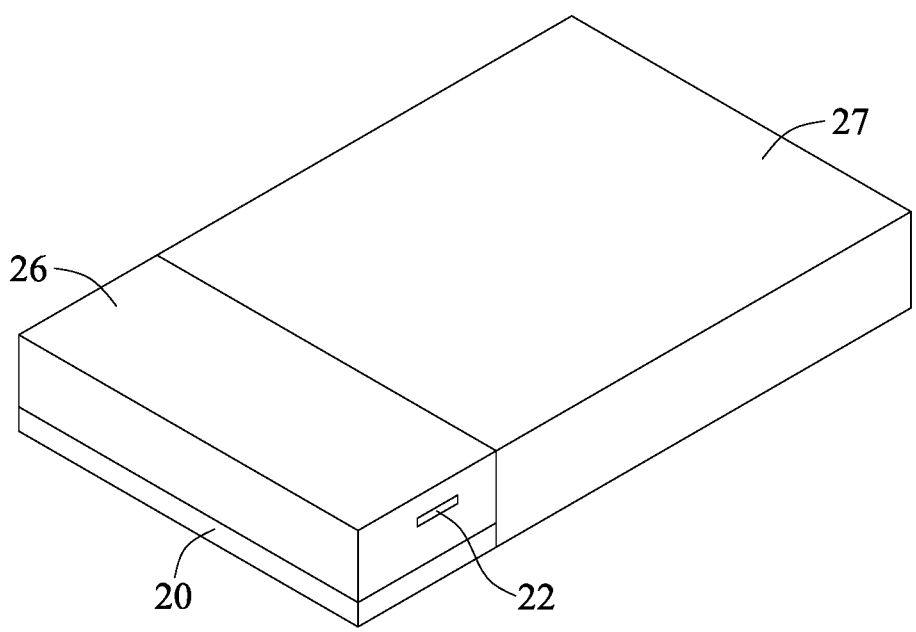

Referring to FIG. 2E, following the process of FIG. 2D, a metal layer 27 is formed on the surface of the encapsulant 26 to encapsulate a portion of the surface of the encapsulant 26 and a portion of the side surface of the substrate 20.

In an embodiment, the metal layer 27 is used for heat dissipating or EMI shielding. The metal layer 27 is formed by sputtering, plating, coating or others, or by disposing a frame, and encapsulates a portion of a surface of the encapsulant 26 and a portion of a side surface of the substrate 20 (and, optionally, is electrically connected to the circuit layer of the substrate 20 exposed from the side surface of the substrate 20). In another embodiment, the metal layer 27 encapsulates the entire surface of the encapsulant 26 and the entire side surface of the substrate 20.

Figure 5B:
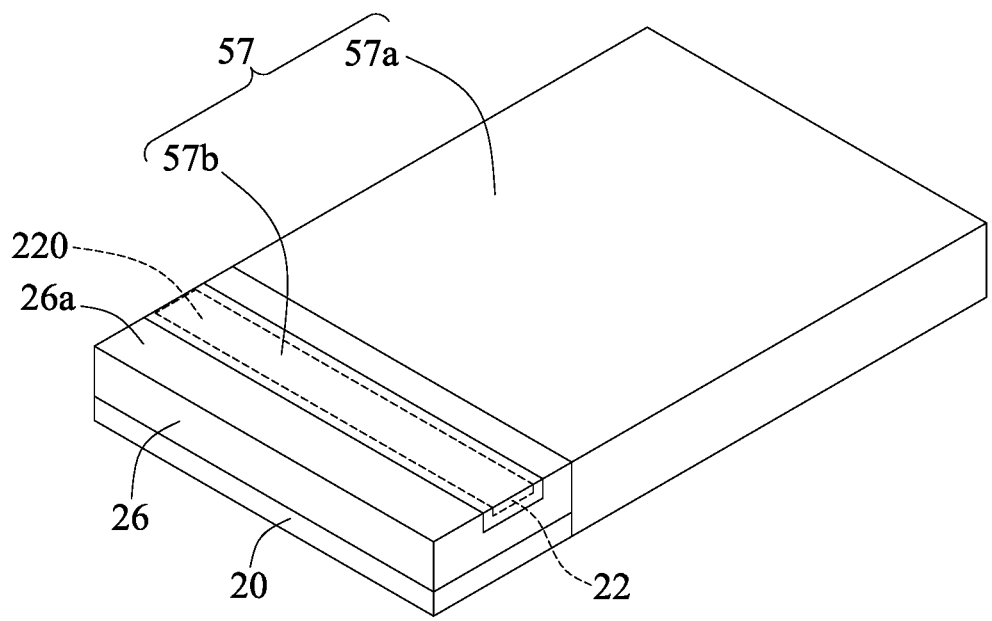
Figure 6A:
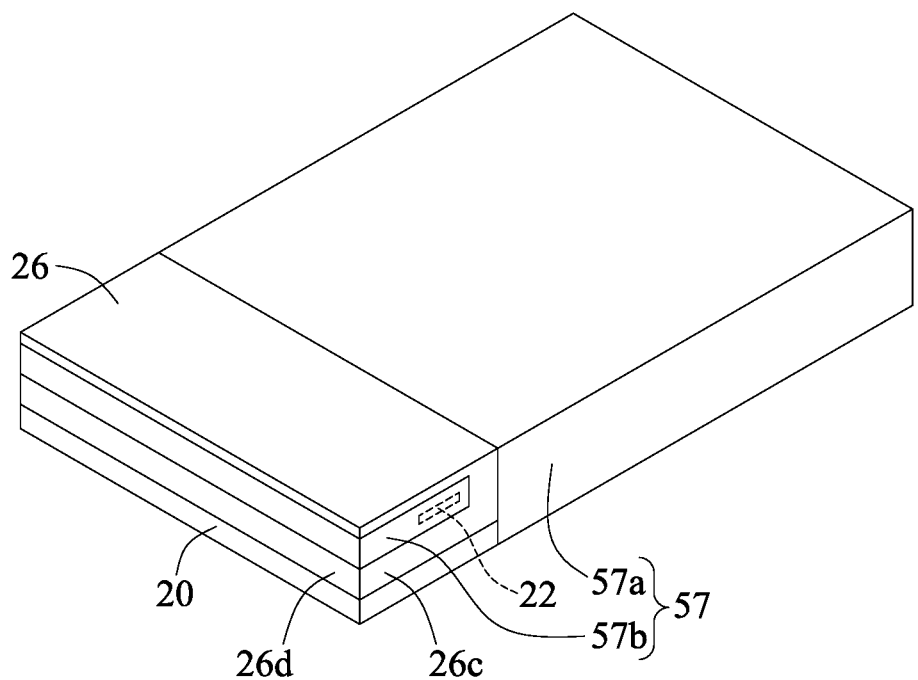
FIGS. 6A to 6C are schematic perspective views showing another embodiment corresponding to FIG. 2E.
Figure 6B:
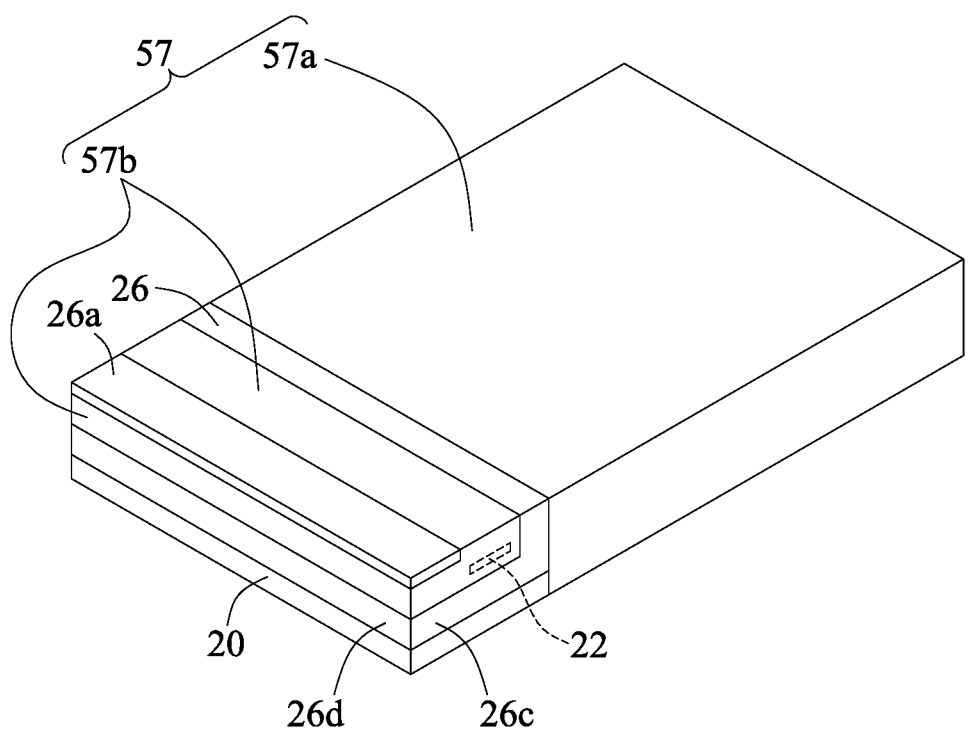

Further, referring to FIG. 2E, the metal layer 27 is electrically connected to the shielding element 23 exposed from the encapsulant 26, or, as shown in FIGS. 5B, 6A and 6B, the metal layer 57 is electrically connected to functional module 2a, such as the antenna element 22 and the shielding element 23. In an embodiment, the metal layer 57 has separated first region 57a and second region 57b. The first region 57a is electrically connected to the shielding element 23, and the second region 57b is electrically connected to the antenna element 22.

Figure 6C:
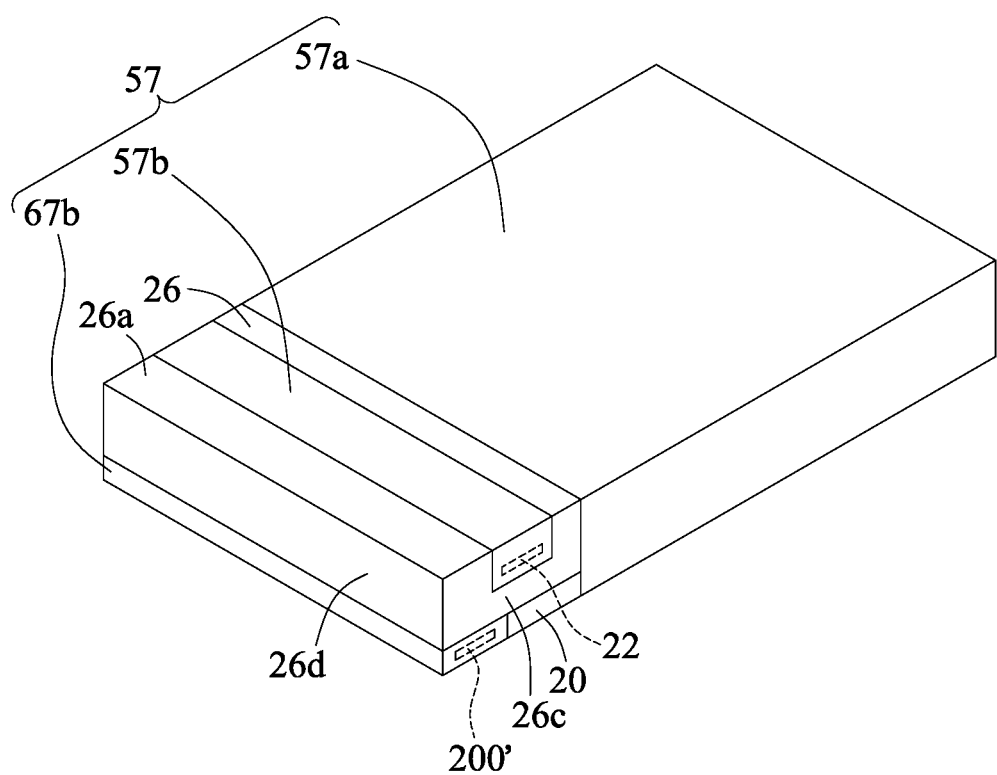

In an embodiment, as shown in FIG. 5B, following the process of FIG. 5A, the second region 57b is formed on the supper surface 26a of the encapsulant 26 and electrically connected to the antenna element 22. In another embodiment, as shown in FIG. 6A, following the process of FIG. 2D, the second region 57b is formed on the adjacent sides surfaces 26c and 26d of the encapsulant 26 and electrically connected to the antenna element 22. In yet another embodiment, as shown in FIG. 6B, following the process of FIG. 2D, the second region 57b is disposed on the upper surface 26a and the side surfaces 26c and 26d of the encapsulant 26 and electrically connected to the antenna element 22. In an embodiment, as shown in FIG. 6C, following the process of FIG. 2D', the circuit layer 200' is electrically connected to a second region 67b on the side surface 20c of the substrate 20 (or the side surfaces 26c and 26d of the encapsulant 26), and the antenna element 22 is electrically connected to the second region 57b on the upper surface 26a of the encapsulant 26.

In an embodiment, the projection location of the second region 57b and the circuits 201 of the substrate 20 are staggered, to avoid the degradation of efficiency of the antenna element 22 due to the overlapping of the second region 57b with the circuit 201.

In another embodiment, the metal layer 27 is not electrically connected to the antenna element 22 or the shielding element 23 (or the connecting portion 24).

Furthermore, if the electronic package structure 2 does not have the encapsulant 26 and the shielding element 23 is a metal frame instead of a metal cover, the metal layer 27 can be frame-disposed over the substrate 20 to cover the electronic components 21.

In an embodiment, after the singulation process shown in FIG. 2D, a portion of surfaces of the antenna element 22 and the shielding element 23 can be exposed from the upper surface 26 of the encapsulant 26 by polishing, laser or cutting knife, to form the metal layer 57 shown in FIG. 5B.

In another embodiment, the metal layer 27, 57 is arranged corresponding to the shape of the encapsulant 26 so as to minimize the volume of the electronic package structure 2 and protect the electronic components 21 and the antenna element 22 against external EMI.

According to the present disclosure, a metal sheet is bent into a 3D functional module 2a. As such, the antenna element 22 and the shielding element 23 of the functional module 2a can be disposed together on the substrate 20 so as to simplify the fabrication process and greatly reduce the fabrication cost.

Further, since the shielding element 23 is positioned between the antenna element 22 and the electronic components 21, the present disclosure prevents electromagnetic interference from occurring between the antenna element 22 and the electronic components 21.

The antenna element 22 can be extended to a region outside of the encapsulant 26 through the second region 57b of the metal layer 57, and thus has an antenna length sufficient to satisfy the electric length required by antenna resonance.

The present disclosure further provides an electronic package structure 2, which has a substrate 20, and a plurality of electronic components 21, an antenna element 22 and a shielding element 23, 33 disposed on the substrate 20.

The substrate 20 has a plurality of circuits 200, 201 and a plurality of grounding pads 202.

At least one of the electronic components 21 is an active component or a passive component. The electronic components 21 are electrically connected to the circuits 200 of the substrate 20.

The antenna element 22 is metal frame and optionally electrically connected to the circuit 201 of the substrate 20.

The shielding element 23, 33 is a metal frame or a metal cover. The shielding element 23, 33 is electrically connected to the grounding pads 202 of the substrate 20.

In an embodiment, the shielding element 23, 33 is not electrically connected to the antenna element 22. In an embodiment, the shielding element 23, 33 is electrically connected to the antenna element 22 through a connecting portion 24, 34. In another embodiment, the connecting portion 24, 34, the antenna element 22 and the shielding element 23, 33 form an open or closed ring-shaped plane.

In an embodiment, the shielding element 23 has a plurality of legs 230 spaced apart from one another at an interval 231.

In an embodiment, the shielding element 23 has a wall-shaped leg 330 positioned between the antenna element 22 and the electronic components 21.

The electronic package structure 2 further has an encapsulant 26 formed on the substrate 20 to encapsulate the electronic components 21, the antenna element 22 and the shielding element 23, 33 (and the connecting portion 24, 34).

In an embodiment, a portion of a surface of the antenna element 22 is exposed from the encapsulant 26. In another embodiment, a portion of a surface of the shielding element 23, 33 is exposed from the encapsulant 26. In a further embodiment, a portion of a surface of the connecting portion 24, 34 is exposed from the encapsulant 26.

In an embodiment, the electronic package structure 2 further comprises the metal layer 27, 57 formed on the encapsulant 26, and the metal layer 27, 57 is electrically connected to the antenna element 22 and/or the shielding element 23.

According to the present disclosure, the functional module allows the antenna element and the shielding element to be disposed together on the substrate so as to simplify the fabrication process and greatly reduce the fabrication cost.

Further, since the shielding element is positioned between the antenna element and the electronic components, the present disclosure prevents electromagnetic interference from occurring between the antenna element and the electronic components.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims

What is claimed is:

1. An electronic package structure, comprising:
a substrate having a surface;
at least one electronic component disposed on the substrate;
an antenna element disposed on the surface of the substrate and electrically connected to the substrate; and
a shielding element disposed on the surface of the substrate and between the antenna element and the electronic component,
wherein the shielding element and the antenna element are arranged side by side in a horizontal direction relative to the surface of the substrate and in contact with the surface of the substrate, and a height of the antenna element is the same as a height of the shielding element.

2. The electronic package structure of claim 1, wherein the substrate has a circuit electrically connected to the antenna element.

3. The electronic package structure of claim 1, wherein the substrate has a grounding pad electrically connected to the shielding element.

4. The electronic package structure of claim 1, wherein the antenna element is a metal frame.

5. The electronic package structure of claim 1, wherein the shielding element is a metal frame or a metal cover.

6. The electronic package structure of claim 1, wherein the shielding element is free from being electrically connected to the antenna element.

7. The electronic package structure of claim 1, wherein the shielding element is electrically connected to the antenna element.

8. The electronic package structure of claim 1, wherein the shielding element has a plurality of legs spaced apart from one another.

9. The electronic package structure of claim 1, wherein the shielding element has a wall-shaped leg disposed between the antenna element and the electronic component.

10. The electronic package structure of claim 1, further comprising an encapsulant formed on the substrate and encapsulating the electronic component, the antenna element and the shielding element.

11. The electronic package structure of claim 10, wherein a portion of a surface of the antenna element is exposed from the encapsulant.

12. The electronic package structure of claim 11, wherein the portion of the surface of the antenna element is flush with a surface of the encapsulant.

13. The electronic package structure of claim 10, wherein a portion of a surface of the shielding element is exposed from the encapsulant.

14. The electronic package structure of claim 13, wherein the portion of the surface of the shielding element is flush with a surface of the encapsulant.

15. The electronic package structure of claim 10, further comprising a metal layer formed on the encapsulant.

16. The electronic package structure of claim 15, wherein the metal layer is electrically connected to at least one of the antenna element and the shielding element.

17. The electronic package structure of claim 15, wherein the metal layer has separated first and second regions, and wherein the first region is electrically connected to the shielding element, and the second region is electrically connected to the antenna element.

18. The electronic package structure of claim 17, wherein the second region is formed on at least one of the upper surface of the encapsulant and the side surface of the encapsulant.

19. The electronic package structure of claim 1, further comprising a connecting portion connecting the antenna element and the shielding element.

20. The electronic package structure of claim 19, wherein the connecting portion, the antenna element and the shielding element form an open or closed ring-shaped plane.

21. The electronic package structure of claim 19, further comprising an encapsulant formed on the substrate and encapsulating the electronic component, the antenna element, the connecting portion and the shielding element.

22. The electronic package structure of claim 19, wherein a portion of a surface of the connecting portion is exposed from the encapsulant.

23. The electronic package structure of claim 22, wherein the portion of the surface of the connecting portion is flush with a surface of the encapsulant.

24. The electronic package structure of claim 19, further comprising a supporting portion extending from the antenna element and the shielding element, wherein at least one assisting region is defined on the substrate around an outer periphery of the electronic component, the antenna element and the shielding element with the supporting portion located on the assisting region.

25. The electronic package structure of claim 24, wherein the shielding element is a metal cover covering the electronic component and a portion of the surface of the substrate.

26. The electronic package structure of claim 1, wherein the substrate has a circuit layer exposed from a side surface thereof.

27. The electronic package structure of claim 26, further comprising an encapsulant and a metal layer, wherein the encapsulant is formed on the substrate and encapsulates the electronic component, the antenna element, and the shielding element, and wherein the metal layer is electrically connected to the circuit layer and disposed on at least one of the side surface of the substrate and a side surface of the encapsulant.

\* \* \* \* \*